United States Patent
Hung et al.

(10) Patent No.: US 9,230,816 B1
(45) Date of Patent: Jan. 5, 2016

(54) METHOD FOR FABRICATING SEMICONDUCTOR DEVICE

(71) Applicant: UNITED MICROELECTRONICS CORP., Hsin-Chu (TW)

(72) Inventors: Ching-Wen Hung, Tainan (TW); Jia-Rong Wu, Kaohsiung (TW); Chih-Sen Huang, Tainan (TW); Yi-Wei Chen, Taichung (TW); Chia Chang Hsu, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/629,502

(22) Filed: Feb. 24, 2015

(30) Foreign Application Priority Data

Feb. 3, 2015 (CN) .......................... 2015 1 0054964

(51) Int. Cl.
| H01L 21/285 | (2006.01) |
| H01L 29/66 | (2006.01) |
| H01L 21/324 | (2006.01) |
| H01L 21/308 | (2006.01) |
| H01L 21/28 | (2006.01) |
| H01L 21/3205 | (2006.01) |

(52) U.S. Cl.
CPC .... *H01L 21/28518* (2013.01); *H01L 21/28052* (2013.01); *H01L 21/3081* (2013.01); *H01L 21/324* (2013.01); *H01L 21/32053* (2013.01); *H01L 29/665* (2013.01)

(58) Field of Classification Search
None
See application file for complete search history.

(56) References Cited

U.S. PATENT DOCUMENTS

| 4,502,210 | A | * | 3/1985 | Okumura | .......... | H01L 21/28512 257/750 |
| 6,013,569 | A | | 1/2000 | Lur et al. | | |
| 7,390,754 | B2 | | 6/2008 | Chang et al. | | |
| 7,750,476 | B2 | * | 7/2010 | Yamazaki | ......... | H01L 21/76805 257/347 |
| 8,358,012 | B2 | * | 1/2013 | Haran | ............... | H01L 21/28518 257/382 |
| 8,921,226 | B2 | | 12/2014 | Hung et al. | | |
| 8,975,672 | B2 | * | 3/2015 | Chiang | ............. | H01L 21/28518 257/288 |
| 9,093,380 | B2 | * | 7/2015 | Lii | .................... | H01L 21/28518 |
| 9,123,783 | B2 | * | 9/2015 | Wang | ................ | H01L 21/28518 |
| 2009/0050972 | A1 | | 2/2009 | Lindsay et al. | | |
| 2014/0199837 | A1 | * | 7/2014 | Hung | ............... | H01L 21/76816 438/675 |

FOREIGN PATENT DOCUMENTS

EP     0 417522 B1     1/2000

OTHER PUBLICATIONS

P.W. Mertens, "Cleaning Challenges and Solutions for Advanced Technology Nodes", ECS Transactions, 41 (5) 3-13 (2011), The Electrochemical Society, 2011.
Hung, Title of Invention: Method for Manufacturing a Contact Structure Used to Electrically Connect a Semiconductor Device, U.S. Appl. No. 14/510,100, filed Oct. 8, 2014.
Hsu, Title of Invention: Method for forming semiconductor device, U.S. Appl. No. 14/607,085, filed Jan. 28, 2015.

* cited by examiner

*Primary Examiner* — Andres Munoz
(74) *Attorney, Agent, or Firm* — Winston Hsu; Scott Margo

(57) ABSTRACT

A method for fabricating semiconductor device is disclosed. The method includes the steps of: providing a substrate having a gate structure thereon and an interlayer dielectric (ILD) layer around the gate structure; forming a dielectric layer on the gate structure and the ILD layer; forming a patterned hard mask on the dielectric layer; forming an opening in the dielectric layer and the ILD layer; performing a silicide process for forming a silicide layer in the opening; removing the patterned hard mask and un-reacted metal after the silicide process; and forming a contact plug in the opening.

8 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of removing patterned hard mask composed of TiN and un-reacted metal after a silicide process is carried out.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, epitaxial layer loss or damage by cleaning agent is commonly observed during current fabrication for FinFET, thereby affecting the performance of the device. Hence, how to improve the current FinFET process has become an important task in this field.

SUMMARY OF THE INVENTION

According to a preferred embodiment of the present invention, a method for fabricating semiconductor device is disclosed. The method includes the steps of: providing a substrate having a gate structure thereon and an interlayer dielectric (ILD) layer around the gate structure; forming a dielectric layer on the gate structure and the ILD layer; forming a patterned hard mask on the dielectric layer; forming an opening in the dielectric layer and the ILD layer; performing a silicide process for forming a silicide layer in the opening; removing the patterned hard mask and un-reacted metal after the silicide process; and forming a contact plug in the opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
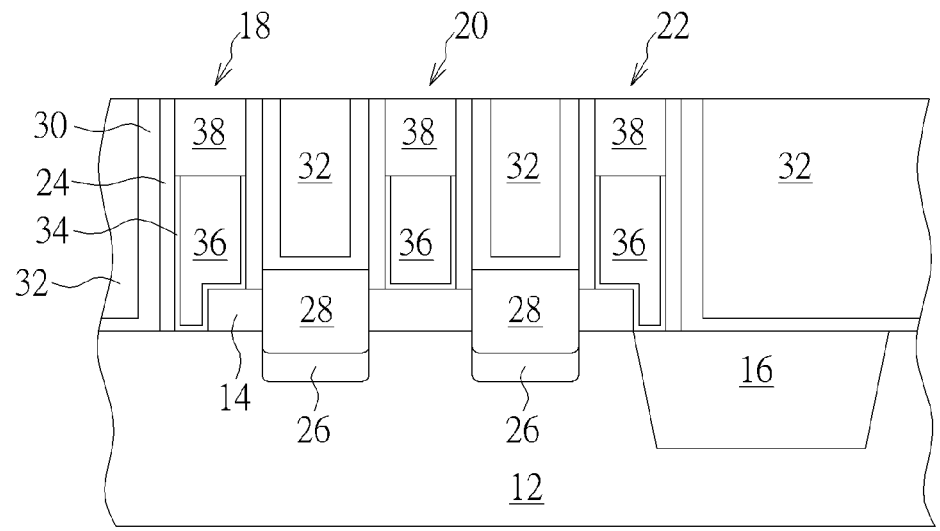
FIGS. 1-8 illustrate a method for fabricating semiconductor device according to a preferred embodiment of the present invention.

Referring to FIGS. 1-8, FIGS. 1-8 illustrate a method for fabricating semiconductor device according to a preferred embodiment of the present invention. It should be noted despite this embodiment pertains to a non-planar MOS transistor, the method of the present invention could be applied to either planar or non-planar transistor devices depending on the demand of the product. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer are formed on the substrate 12, in which the bottom of the fin-shapes structure 14 is preferably enclosed by the insulating layer preferably composed of silicon oxide to form a shallow trench isolation (STI) 16. A plurality of gate structures 18, 20, 22 are formed on part of the fin-shaped structure 14.

The formation of the fin-shaped structure 14 could include first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form a STI 16 surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI 16 to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI 16 could be eliminated.

The fabrication of the gate structures 18, 20, 22 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the STI 16, and a spacer 24 is formed on the sidewall of the dummy gates. A source/drain region 26 and epitaxial layer 28 are then formed in the fin-shaped structure 14 and/or substrate 12 adjacent to two sides of the spacer 24, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gate into a metal gates 18, 20, 22. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gate for forming a recess (not shown) in the ILD layer 32. Next, a conductive layer including at least a U-shaped work function metal layer 34 and a low resistance metal layer 36 is formed in the recess, and a planarizing process is conducted thereafter so that the surface of the U-shaped work function metal layer 34 and low resistance metal layer 36 is even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the gate structures 18, 20, 22, part of the work function metal layer 34 and low resistance metal layer 36 could be removed, and a hard mask 38 is formed on the work function metal layer 34 and the low resistance metal layer 36. The hard mask 38 could be a single material layer or composite material layer, such as a composite layer containing both silicon oxide and silicon nitride.

Figure 2:
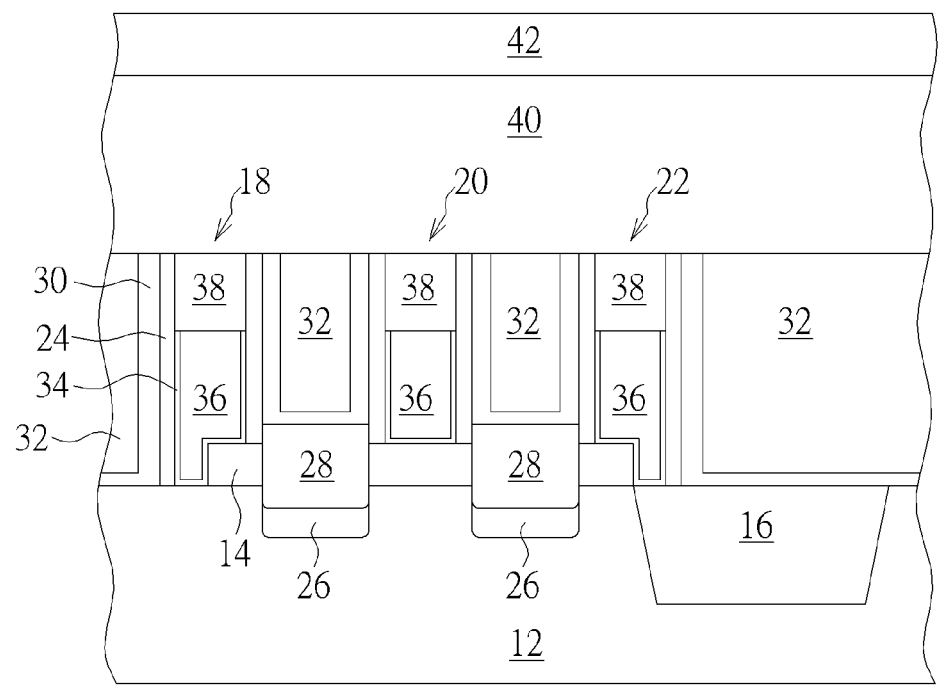

Next, as shown in FIG. 2, a dielectric layer 40 is covered entirely on the gate structures 18, 20, 22 and ILD layer 32, and a hard mask 42 is formed on the dielectric layer 40 thereafter. In this embodiment, the dielectric layer 40 is preferably used as a pre-metal dielectric (PMD) layer, in which the dielectric layer 40 and ILD layer 32 could be composed of same or different material, such as TEOS. The hard mask 42 is preferably a metal hard mask composed of TiN.

Figure 3:
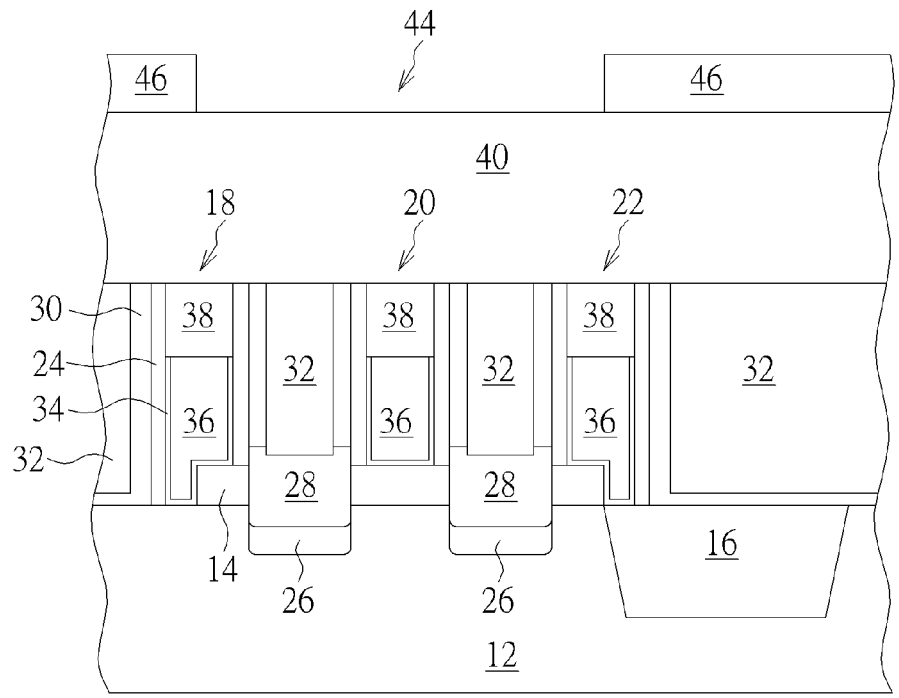

Next, as shown in FIG. 3, a photo-etching process is conducted by first forming a patterned resist (not shown) on the hard mask 42, and then using etching to remove part of the hard mask 42 for forming an opening 44 exposing part of the dielectric layer 40 surface while turning the hard mask 42 into a patterned hard mask 46.

Figure 4:
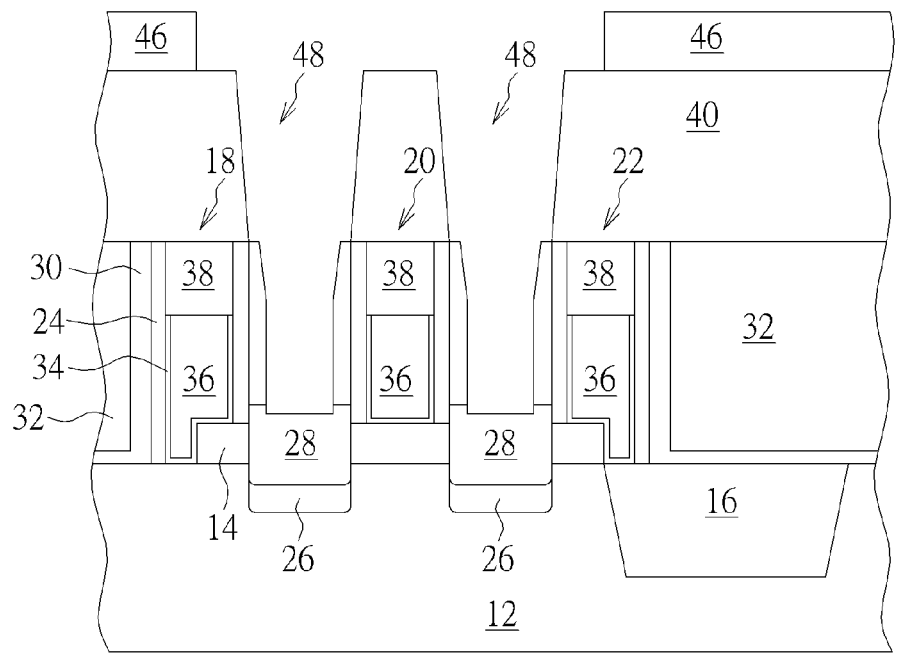

Next, as shown in FIG. 4, one or more photo-etching process along with patterned openings from other regions could be conducted to remove part of the hard mask 46, part of the dielectric layer 40, and part of the ILD layer 32 for forming openings 48 exposing the epitaxial layer 28.

Figure 5:
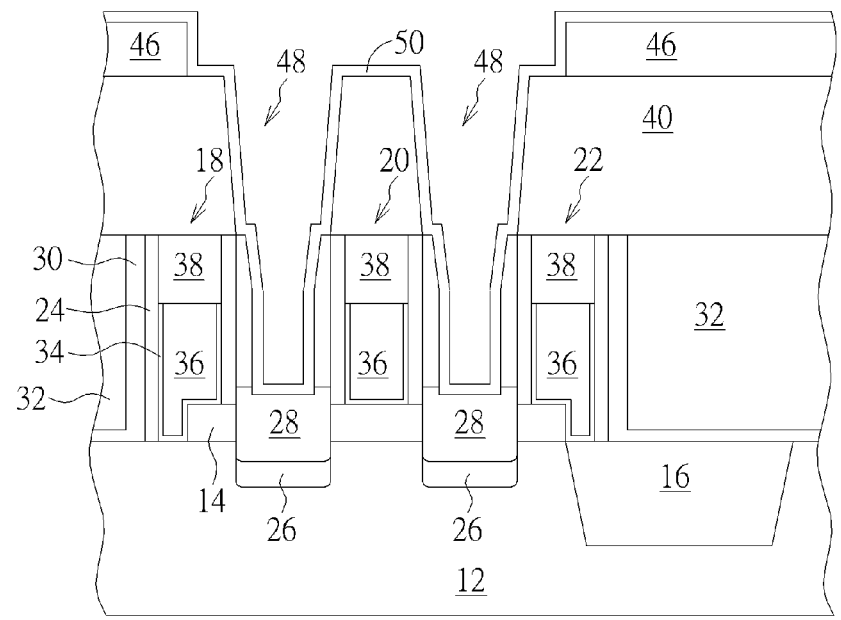

Next, as shown in FIG. 5, a silicide process is conducted to form a silicide layer (not shown) in the openings 48. In this embodiment, the silicide process could be accomplished by first using a pre-clean to remove remaining particles from the surface of the patterned hard mask 46, dielectric layer 40, and epitaxial layer 28, and then forming a first metal layer 50 on the patterned hard mask 46 and dielectric layer 40 and into the openings 48, especially on the CESL 30 and epitaxial layer 28 surface within the openings 48. In this embodiment, the first metal layer is preferably composed of Ni or Ti, but not limited thereto. A selective cap layer (not shown) composed of TiN could then be formed on the first metal layer 50 thereafter.

Figure 6:
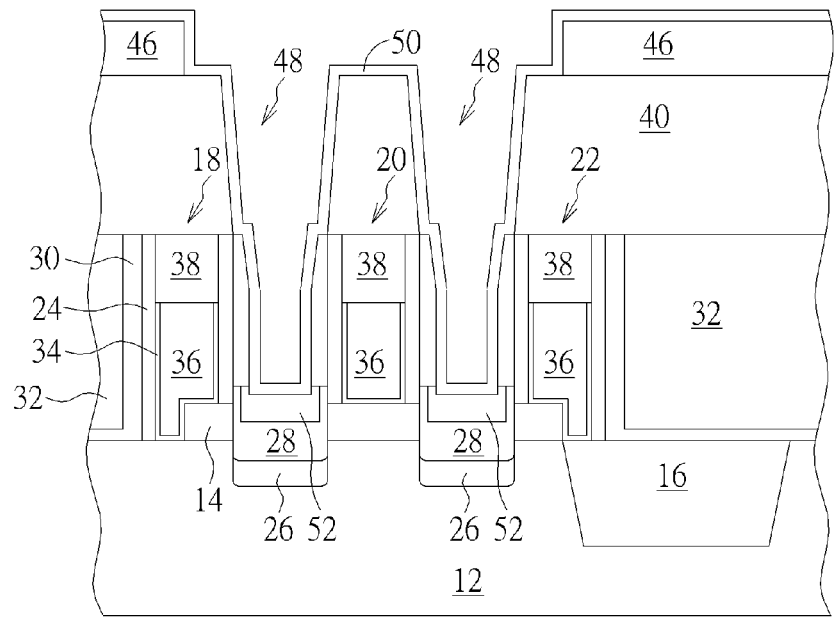

Next, as shown in FIG. 6, a rapid thermal anneal (RTA) process is conducted so that the first metal layer 50 would react with silicon within the epitaxial layer 28 to form a silicide layer 52. It should be noted that since the first metal layer 50 contacting the epitaxial layer 28 is transformed into silicide layer 52 entirely during the RTA process, the remaining first metal layer 50, or the un-reacted metal from the silicide process would still remain on the hard mask 46 surface, dielectric layer 40 surface, and CESL 30 surface inside the openings 48.

Figure 7:
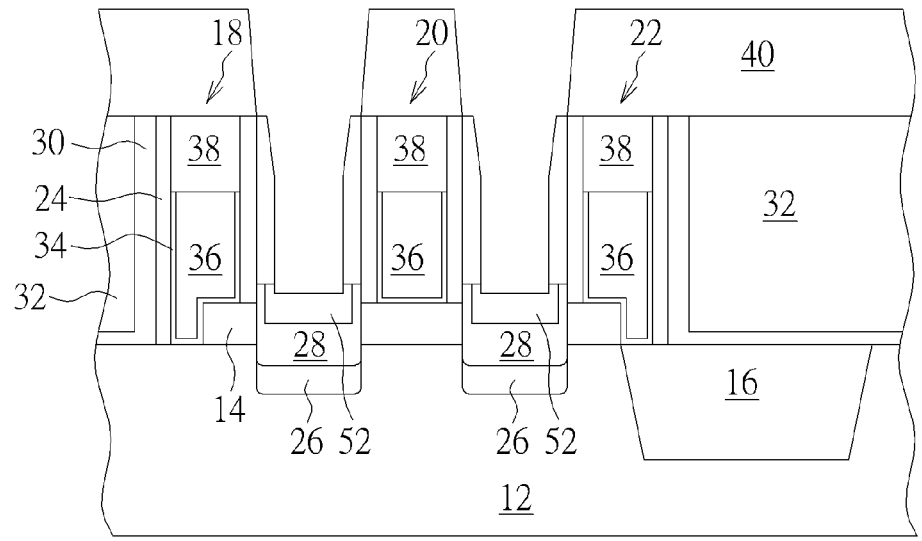

Next, as shown in FIG. 7, a sulfuric acid-hydrogen peroxide mixture (SPM) is utilized to remove the patterned hard mask 46, the un-reacted metal from the silicide process or all of the remaining first metal layer 50 on the patterned hard mask 46 surface, dielectric layer 40 surface, and CESL surface 30, and the selective TiN cap layer formed on the first metal layer 50 surface. It should be noted that since only the silicide layer 52 is exposed from the openings 48 during the removal of the patterned hard mask 46 and un-reacted metal, the surface the epitaxial layer 28 is therefore protected from the SPM used during the aforementioned removal process so that loss of epitaxial layer 28 is also prevented effectively.

Figure 8:
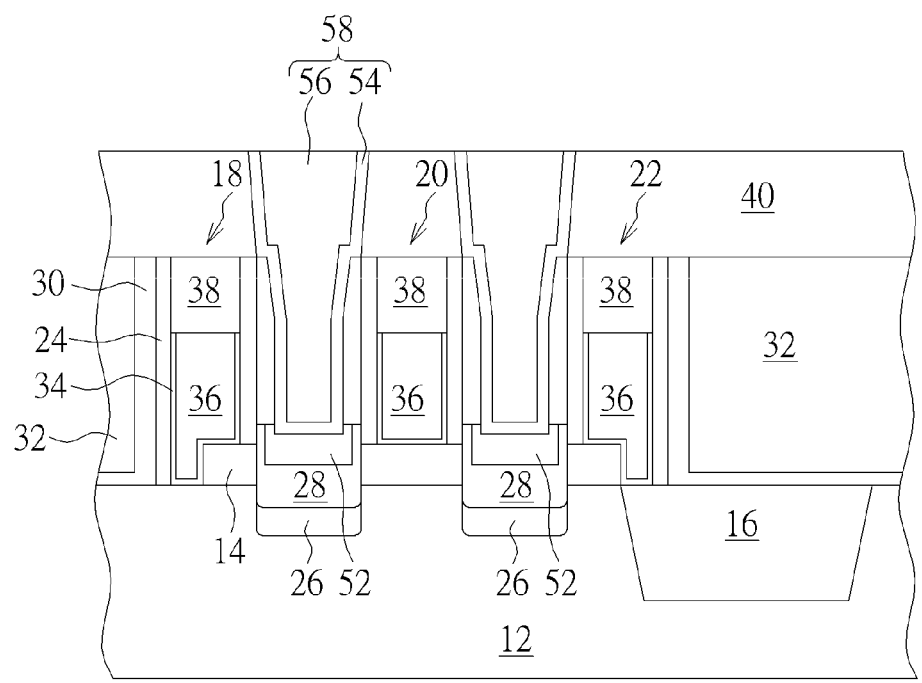

Next, as shown in FIG. 8, a second metal layer 54 is formed on the dielectric layer 40 surface, CESL 30 surface, and silicide layer 52 surface, and a third metal layer 56 is formed on the second metal layer 54 and into the openings 48, in which the second metal layer 54 is selected from the material consisting of Ta, Ti, TiN, TaN, and WN, and the third metal layer 56 is selected from the material consisting of Al, Ti, Ta, W, Nb, Mo, and Cu, but not limited thereto. Next, a planarizing process, such as a chemical mechanical polishing (CMP) process is conducted to remove part of the third metal layer 56, part of the second metal layer 54, and even part of the dielectric layer 40 to form contact plugs 58. This completes the fabrication of a semiconductor device according to a preferred embodiment of the present invention.

Figure 9:
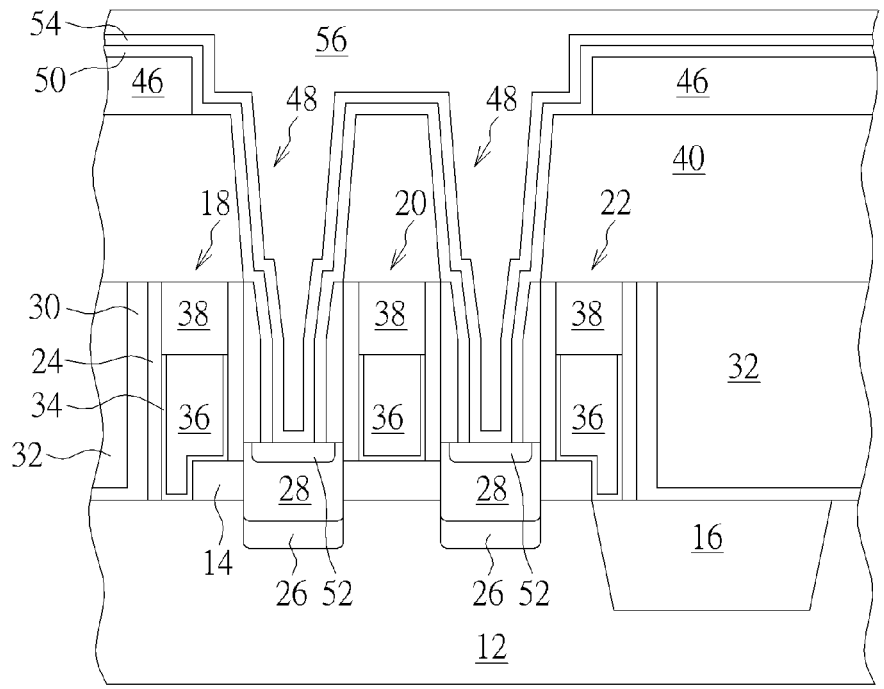
FIGS. 9-10 illustrate a method for fabricating semiconductor device according to another embodiment of the present invention.
Figure 10:
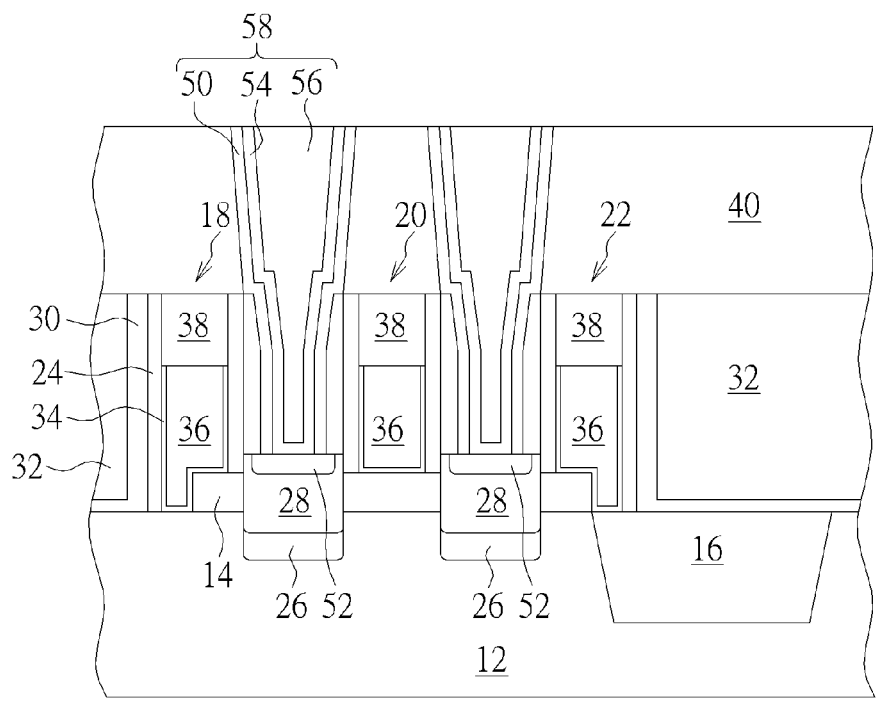

Referring to FIGS. 9-10, FIGS. 9-10 illustrate a method for fabricating semiconductor device according to another embodiment of the present invention. As shown in FIG. 9, instead of using SPM to directly remove the patterned hard mask 46 and un-reacted metal after the silicide layer 52 is formed, the present embodiment while not removing un-reacted metal or part of the first metal layer 50 still remains on the patterned hard mask 46 surface, dielectric layer 40 surface, and CESL 30 surface, forms the second metal layer 54 directly on the silicide layer 52 surface and first metal layer 50 surface and the third metal layer 56 on the second metal layer 54 and filling the openings 48. Alternatively, it would also be desirable to form the first metal layer 50 and second metal layer 54 on the patterned hard mask 46 and dielectric layer 40 to fill the openings 48 after openings 48 are formed and epitaxial layer 28 is exposed, and then perform a RTA process so that the first metal layer 50 would react with silicon in the epitaxial layer 28 to form a silicide layer 52. The composition of the first metal layer 50, second metal layer 54 and third metal layer 56 could be the same as the ones disclosed in the aforementioned embodiment, and the details of which are not explained herein for the sake of brevity.

Next, as shown in FIG. 10, a planarizing process, such as CMP process is conducted to remove part of the third metal layer 56, part of the second metal layer 54, part of the first metal layer 50, the patterned hard mask 46, and even part of the dielectric layer 40 so that the surface of the remaining first metal layer 50, second metal layer 54, and third metal layer 56 is even with the dielectric layer 40 surface thereby forming a plurality of contact plugs 58. In this embodiment, the remaining first metal layer 50 would not be removed and remain on the sidewall surface of the openings 48 and remaining first metal layer 50 and the second metal layer 54 would also form a barrier layer of the contact plugs altogether. This completes the fabrication of a semiconductor device of this embodiment.

Overall, in contrast to the conventional approach of utilizing SPM to remove patterned hard mask composed of TiN before formation of silicide layer, the present invention preferably removes the patterned hard mask after silicide layer is formed, in which the patterned hard mask and un-reacted from the silicide process could be removed simultaneously by either using SPM as disclosed in the first embodiment or planarizing approach as disclosed in the second embodiment. This effectively reduces the risk of exposing epitaxial layer to the cleaning agent such as SPM during removal of patterned hard mask by SPM and issue such as epitaxial layer loss could be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a gate structure thereon and an interlayer dielectric (ILD) layer around the gate structure;
   forming a dielectric layer on the gate structure and the ILD layer;
   forming a patterned hard mask on the dielectric layer;
   forming an opening in the dielectric layer and the ILD layer;
   performing a silicide process to form a silicide layer in the opening;
   removing the patterned hard mask and un-reacted metal after the silicide process; and
   forming a contact plug in the opening.

2. The method of claim 1, wherein the dielectric layer comprises TEOS.

3. The method of claim 1, wherein the patterned hard mask comprises TiN.

4. The method of claim 1, wherein the silicide process comprises:
   forming a first metal layer on the patterned hard mask, the dielectric layer, and into the opening;
   performing a rapid thermal anneal (RTA) process to form the silicide layer on an epitaxial layer adjacent to the gate structure;
   removing the patterned hard mask and un-reacted metal from the silicide process;
   forming a second metal layer and a third metal layer in the opening; and
   planarizing the third metal layer and the second metal layer for forming the contact plug.

5. The method of claim 4, wherein the first metal layer comprises Ni or Ti.

6. The method of claim 4, wherein the second metal layer is selected from a material consisting of Ta, Ti, TiN, TaN, or WN.

7. The method of claim 4, wherein the third metal layer is selected from a material consisting of Al, Ti, Ta, W, Nb, Mo, or Cu.

8. The method of claim 1, further comprising utilizing sulfuric acid-hydrogen peroxide mixture (SPM) for removing the patterned hard mask and un-reacted metal from the silicide process.

* * * * *